United States Patent
Disney

(10) Patent No.: US 7,494,875 B2
(45) Date of Patent: *Feb. 24, 2009

(54) GATE ETCH PROCESS FOR A HIGH-VOLTAGE FET

(75) Inventor: Donald Ray Disney, Cupertino, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/075,897

(22) Filed: Mar. 15, 2008

(65) Prior Publication Data

US 2008/0160705 A1 Jul. 3, 2008

Related U.S. Application Data

(63) Continuation of application No. 11/542,083, filed on Oct. 3, 2006, now Pat. No. 7,381,618.

(51) Int. Cl.
*H01L 21/336* (2006.01)

(52) U.S. Cl. .................. 438/268; 438/197; 257/328

(58) Field of Classification Search .................. 438/268
See application file for complete search history.

*Primary Examiner*—Thao X Le
*Assistant Examiner*—Kimberly Trice
(74) *Attorney, Agent, or Firm*—The Law Offices of Bradley J. Bereznak

(57) ABSTRACT

A method, in one embodiment, includes etching first and second dielectric regions in a substantially isotropic manner through first and second openings of a mask layer to create first and second trenches. The first and second dielectric regions are disposed on opposite sides of a mesa of semiconductor material, the mesa having first and second sidewalls that respectively adjoin the first and second dielectric regions. The first and second dielectric regions in the first and second trenches are then etched in a substantially isotropic manner to expose the first and second sidewalls. A gate oxide is formed on the first and second sidewalls of the mesa. It is emphasized that this abstract is provided to comply with the rules requiring an abstract that will allow a searcher or other reader to quickly ascertain the subject matter of the technical disclosure.

6 Claims, 4 Drawing Sheets

GATE ETCH PROCESS FOR A HIGH-VOLTAGE FET

This application is a continuation of application Ser. No. 11/542,083, filed Oct. 3, 2006, entitled, "Gate Etch Process for a High-Voltage FET", which is assigned to the assignee of the present application.

TECHNICAL FIELD

The present disclosure relates to semiconductor processes for fabricating high-voltage, field-effect transistors.

BACKGROUND

High-voltage, field-effect transistors (HVFETs) are well known in the semiconductor arts. Many HVFETs employ a device structure that includes an extended drain region that supports or blocks the applied high-voltage (e.g., several hundred volts) when the device is in the "off" state. In a conventional vertical HVFET structure, a mesa of semiconductor material forms the extended drain or drift region for current flow in the on-state. A trench gate structure is formed near the top of the substrate, adjacent the sidewall regions of the mesa where the body region is disposed. Application of an appropriate voltage potential to the gate causes a conductive channel to be formed along the vertical sidewall portion of the body region such that current may flow vertically through the semiconductor material, i.e., from a top surface of the substrate where the source region is disposed, down to the bottom of the substrate where the drain region is located.

BRIEF DESCRIPTION OF THE DRAWINGS

The present invention is illustrated by way of example, and not limitation, in the figures of the accompanying drawings, wherein.

DESCRIPTION OF EXAMPLE EMBODIMENTS

In the following description specific details are set forth, such as material types, dimensions, structural features, processing steps, etc., in order to provide a thorough understanding of the present invention. However, persons having ordinary skill in the relevant arts will appreciate that these specific details may not be needed to practice the present invention.

It should be understood that the elements in the figures are representational, and are not drawn to scale in the interest of clarity. It is also appreciated that although a method for fabricating an N-channel HVFET device is disclosed, a P-channel HVFET may also be fabricated by utilizing the opposite conductivity types for all of the illustrated doped regions. Furthermore, although the figures appear to show a single device, those of skill will understand that such transistor structures are commonly fabricated in a repeated, inter-digitated, or otherwise replicated manner. In other words, the method for fabricating a vertical HVFET device structure shown by way of the various example processing steps in FIGS. 1A-1I may be utilized to construct a device having plurality of parallel-arranged or replicated regions.

FIG. 1 illustrates an example cross-sectional side view of a vertical HVFET in a fabrication process after the initial step of forming an epitaxial layer 12 of N-type semiconductor material on an N+ doped silicon substrate 11. In one embodiment, epitaxial layer 12 has a vertical thickness in a range about 15 μm to 120 μm thick. The N+ substrate 11 is heavily doped to minimize its resistance to current flowing through to the drain electrode, which is located on the bottom of the substrate in the completed device. Doping of epitaxial layer 12 may be carried out as the layer is being formed. In one embodiment, the doping concentration of epitaxial layer 12 is linearly graded to produce an extended drain region that exhibits a substantially uniform electric-field distribution. Linear grading may stop at some point below the top surface of the epitaxial layer 12.

Figure 1A:
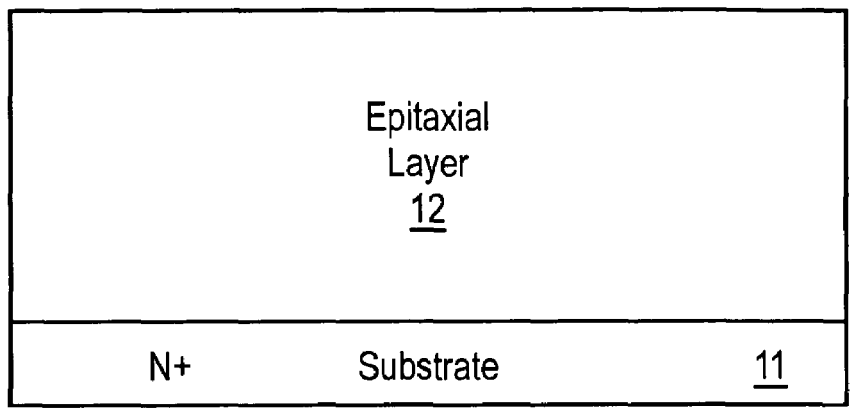
FIG. 1A illustrates an example cross-sectional side view of a vertical HVFET in a fabrication process after the initial step of forming an epitaxial layer on a substrate.
Figure 1B:
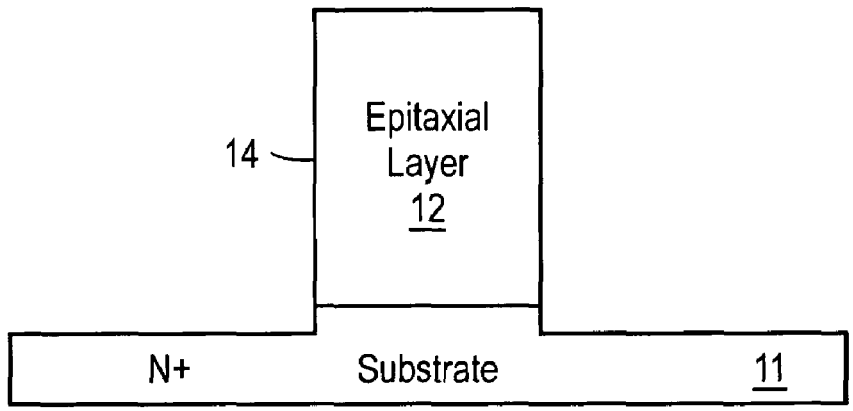
FIG. 1B illustrates the example device structure of FIG. 1A following vertical trench etching that forms a silicon mesa.

After epitaxial layer 12 has been formed, the top surface of the semiconductor wafer is appropriately masked and deep vertical trenches are then etched into epitaxial layer 12. FIG. 1B illustrates an example cross-sectional side view of a vertical HVFET in a fabrication process following vertical trench etching that forms a silicon mesa 14. The height and width of mesa 14, as well as the spacing between adjacent vertical trenches may be determined by the breakdown voltage requirements of the device. Mesa 14 of epitaxial material 12 eventually forms the N-type drift region of the final HVFET device structure. It should be understood that mesa 14, in various embodiments, may extend a considerable lateral distance in an orthogonal direction (into and out of the page). In certain embodiments, the lateral width of the N-type drift region formed by mesa 14 is as narrow as can be reliably manufactured in order to achieve a very high breakdown voltage (e.g., 600V).

Figure 1C:
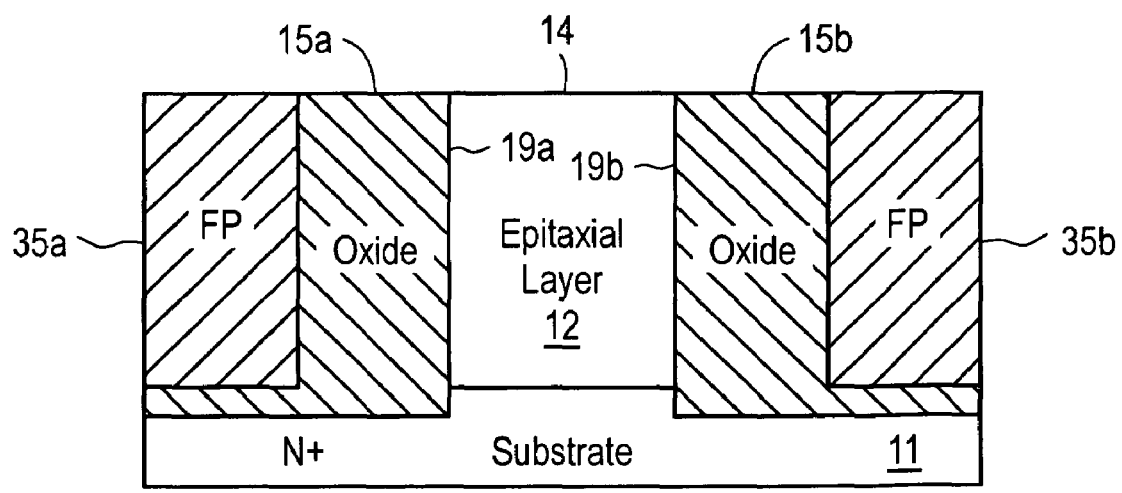
FIG. 1C illustrates the example device structure of FIG. 1B after formation of a dielectric layer on the sidewalls of the mesa and filling of the remaining portions of the trenches with polysilicon.

FIG. 1C illustrates the example device structure of FIG. 1B after formation of a dielectric layer, on the sidewalls of mesa 14 to form oxide regions 15, and subsequent filling of the remaining portions of the trenches with polysilicon or another suitable material to form field plates 35a & 35b. The dielectric layer preferably comprises silicon dioxide, though silicon nitride or other suitable dielectric materials may also be used. In this example, oxide region 15a covers sidewall 19a of mesa 14, while oxide region 15b covers sidewall 19b on the opposite side of mesa 14. Sidewall oxide regions 15a & 15b also cover the exposed portion of N+ substrate 11 in each of the respective trenches. Oxide regions 15 may be formed using a variety of well-known methods, including thermal growth and chemical vapor deposition.

Following the formation of sidewall oxide regions 15, the remaining open portions of the trenches are filled with a conductive material that forms field plates 35a & 35b. The top surface of the substrate may then be planarized utilizing conventional techniques such as chemical-mechanical polishing. The conductive material used to from the field plates may comprise a heavily doped polysilicon, a metal (or metal alloys), a silicide, or other suitable materials. In the completed device structure, field plate members 35a & 35b normally function as capacitive plates that may be used to deplete the extended drain region of charge when the HVFET is in the off state (i.e., when the drain is raised to a high voltage potential). In one embodiment, the lateral thickness of sidewall oxide 15 that separates each field plate 35 from sidewall 19 of mesa 14 is approximately 4 μm.

Figure 1D:
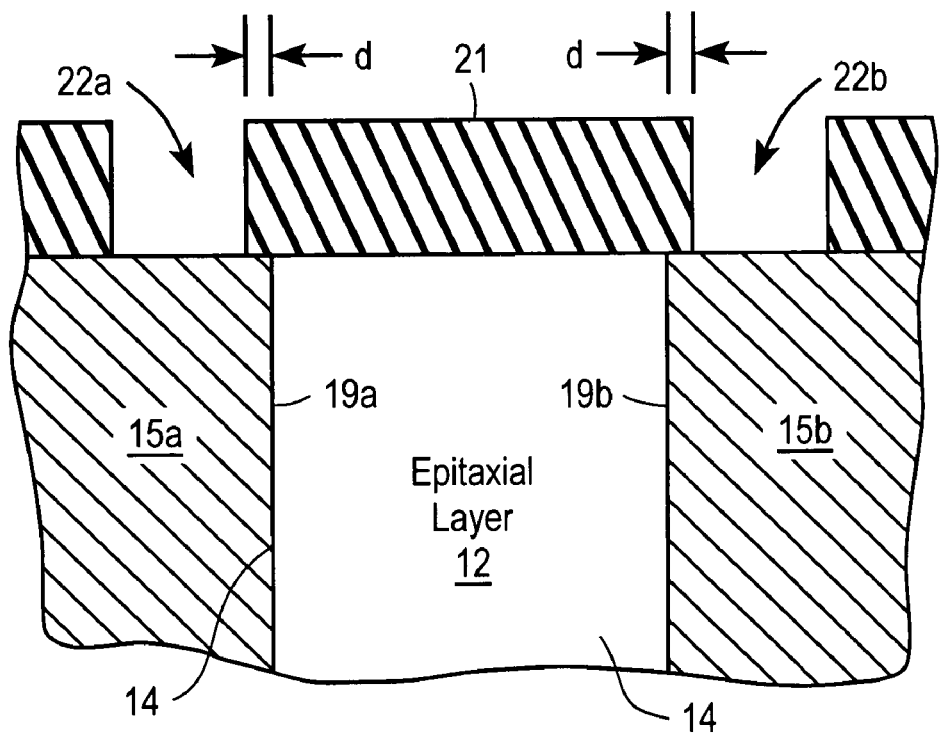
FIG. 1D illustrates the example device structure of FIG. 1C after masking of a top surface of the silicon substrate.

FIG. 1D illustrates the example device structure of FIG. 1C after masking of a top surface of the silicon substrate. In this example, the masking layer 21 comprises a layer of photoresist having openings 22a and 22b over oxide regions 15a and 15b, respectively, on opposite sides of mesa 14. Note that the portion of masking layer 21 directly above mesa 14 extends or overlaps a distance "d" beyond the edge of sidewall 19 over each side of the mesa to cover first and second sidewall portions of oxide regions 15a and 15b. That is, the edge of each opening 22 closest to mesa 14 is not coincident with sidewall 19 of mesa 14; rather, openings 22 are intentionally offset so that the nearest edge of each opening 22 is a small distance away from the corresponding mesa sidewall 19. In one embodiment, the overlap distance "d" is approximately 0.2 μm to 0.5 μm.

Figure 1E:
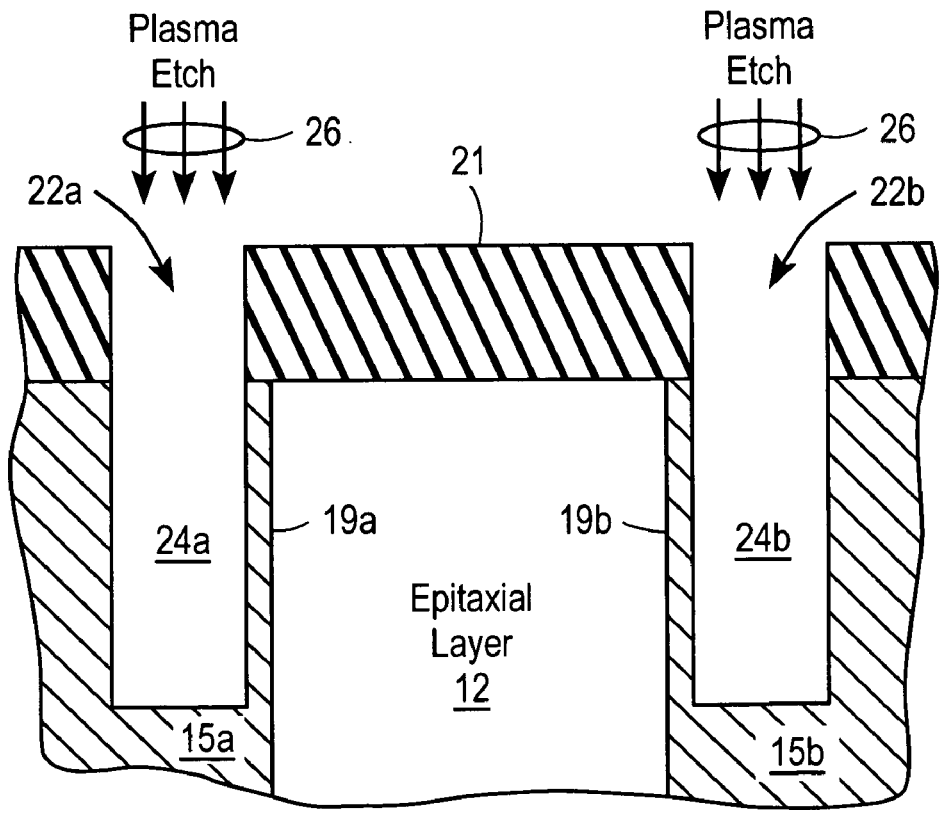
FIG. 1E illustrates the example device structure of FIG. 1D after formation of the gate trenches.

FIG. 1E illustrates the example device structure of FIG. 1D after formation of the gate trenches 24a and 24b. Gate trenches 24a and 24b are formed by a first dielectric etch (shown by arrows 26) that removes the dielectric material of oxide regions 15 in the areas directly below openings 22. In one embodiment, the first dielectric etch is a plasma etch that is substantially anisotropic. First dielectric etch 26 is performed down to the desired or target depth, which is about 3 μm deep in one embodiment. A mixture of $C_4F_8/CO/Ar/O_2$ gases, for example, may be utilized for plasma etch 26. Note that the anisotropic nature of the first etch produces a substantially vertical sidewall profile in the gate trench that does not extend or penetrate to the sidewalls 19 of mesa 14. Stated differently, the overlap distance "d" of masking layer 21 is such that anisotropic etching through openings 22 does not attack the silicon mesa sidewalls 19; instead, a portion of the dielectric material comprising oxide regions 15 still remains covering sidewalls 19 after the first dielectric etch.

Figure 1F:
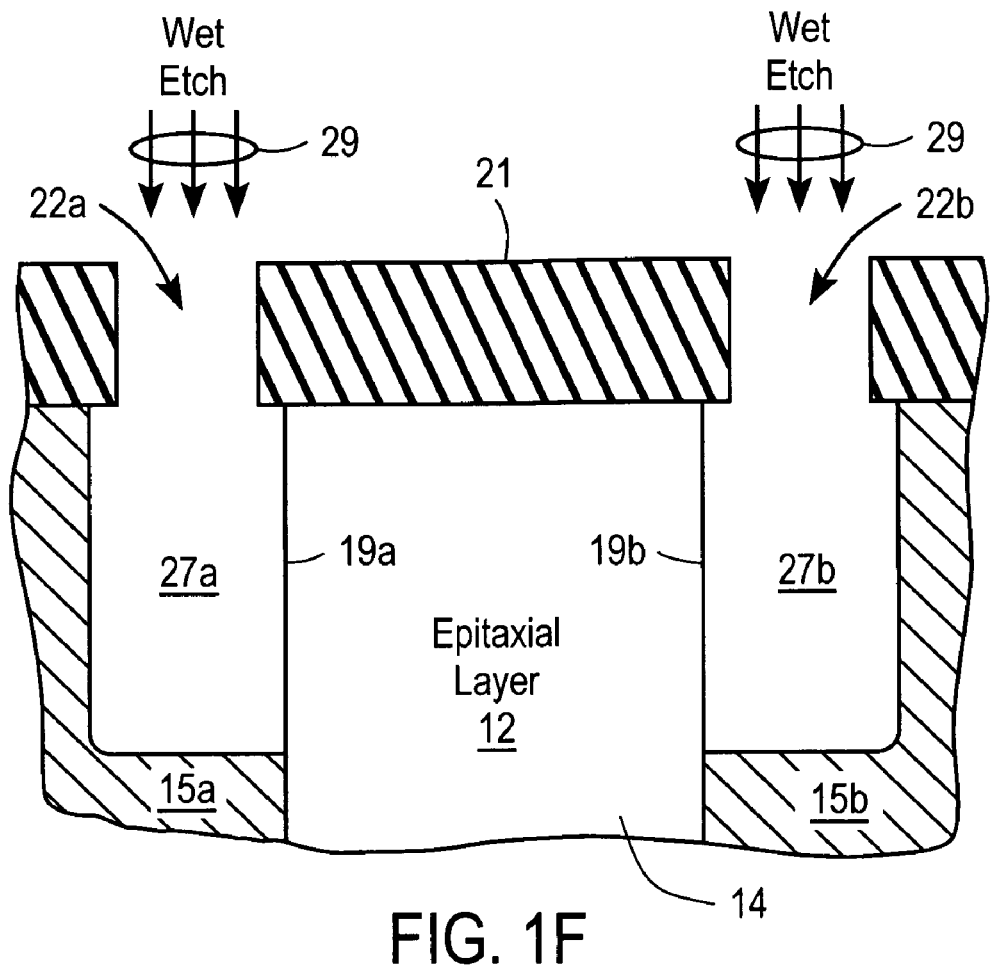
FIG. 1F illustrates the example device structure of FIG. 1E following removal of the oxide covering the sidewalls of the mesa in the gate trenches.

FIG. 1F illustrates the example device structure of FIG. 1E following removal of the oxide covering the sidewalls 19 of mesa 14 in the gate trenches. A second dielectric etch (shown by arrows 29) may performed through openings 22a & 22b of masking layer 21 to completely remove the remaining oxide on sidewalls 19a and 19b. In one embodiment, the second dielectric etch is a wet etch (e.g., using buffered HF) that is substantially isotropic in nature. The result is a pair of gate trench openings 27a and 27b that expose the epitaxial silicon material along sidewalls 19a & 19b, respectively, of mesa 14.

In the embodiment shown, the second dielectric etch 29 is highly selective, which means that it etches the dielectric material at a much faster rate than it etches silicon. Using this process, the silicon surface of each sidewall 19 is undamaged, thereby allowing a high-quality gate oxide to be subsequently grown on the sidewall surface. In addition, due to the substantially isotropic nature of the second dielectric etch, the gate trench is etched at a similar rate in both the vertical and lateral directions. However, as the second dielectric etch is utilized to remove the remaining few tenths of a micron of silicon dioxide on the silicon mesa sidewall, the overall effect on the aspect ratio of trench gate openings 27 is relatively insignificant. In one embodiment, the lateral width of each gate trench opening 27 is approximately 1.5 μm wide, and the final depth is approximately 3.5 μm.

Figure 1G:
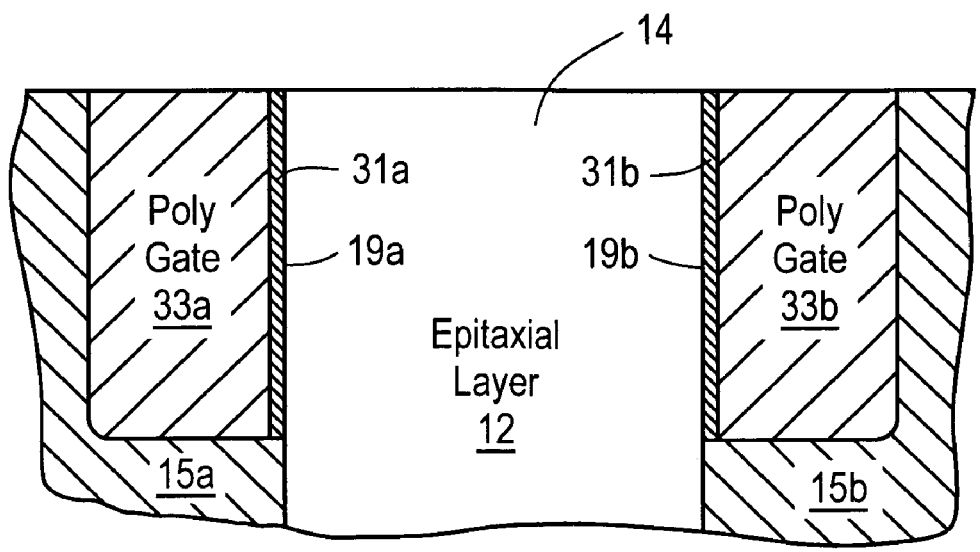
FIG. 1G illustrates the example device structure of FIG. 1F after removal of the masking layer, formation of a thin gate oxide the sidewalls of the mesa, and subsequent filling of the gate trenches.

FIG. 1G illustrates the example device structure of FIG. 1F after removal of the masking layer 21, formation of a high-quality, thin (e.g., ~500 Å) gate oxide layer 31, which covers the exposed portions of sidewalls 19, and subsequent filling of the gate trenches. In one embodiment, gate oxide layer 31 is thermally grown with a thickness in the range of 100 to 1000Å. Masking layer 21 is removed prior to formation of gate oxide 31. The remaining portion of each gate trench is filled with doped polysilicon or another suitable material, which form gate members 33a & 33b in the completed device structure.

Figure 1H:
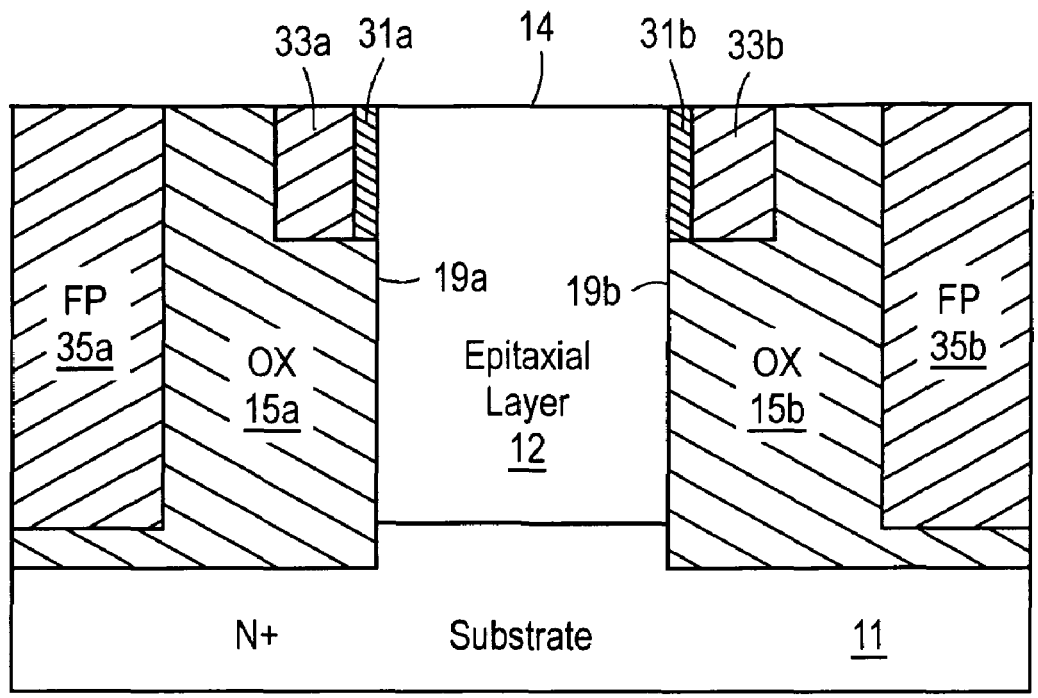
FIG. 1H illustrates the example device structure of FIG. 1G in an expanded view that shows the field plates in relation to the trench gate structure.

FIG. 1H illustrates the example device structure of FIG. 1G in an expanded view that shows field plates 35a & 35b in relation to the trench gate structure. The trench gate structure includes gate members 33 disposed adjacent to, and insulated from, sidewalls 19 of mesa 14 by gate oxide layer 31.

Practitioners in the art will appreciate that the overlap distance "d" of masking layer 21 should be sufficiently large enough such that even under a worst-case mask misalignment error scenario, the resulting overlap of masking layer 21 with respect to the sidewall of mesa 14 still prevents plasma etch 26 from attacking the silicon material along either one of sidewalls 19. Similarly, the masking distance "d" of masking layer 21 should not be so large such that in a worst-case mask misalignment scenario the oxide remaining on either one of sidewalls 19 cannot be removed by a reasonable second dielectric etch. If, for example, the overlap distance "d" happens to be too large, the second dielectric etch 29 needed to remove the oxide covering sidewalls 19 might result in excessive thinning of the oxide remaining between (i.e., separating) gate members 33 and field plates 35, potentially leading to inadequate isolation between these elements.

Figure 1I:
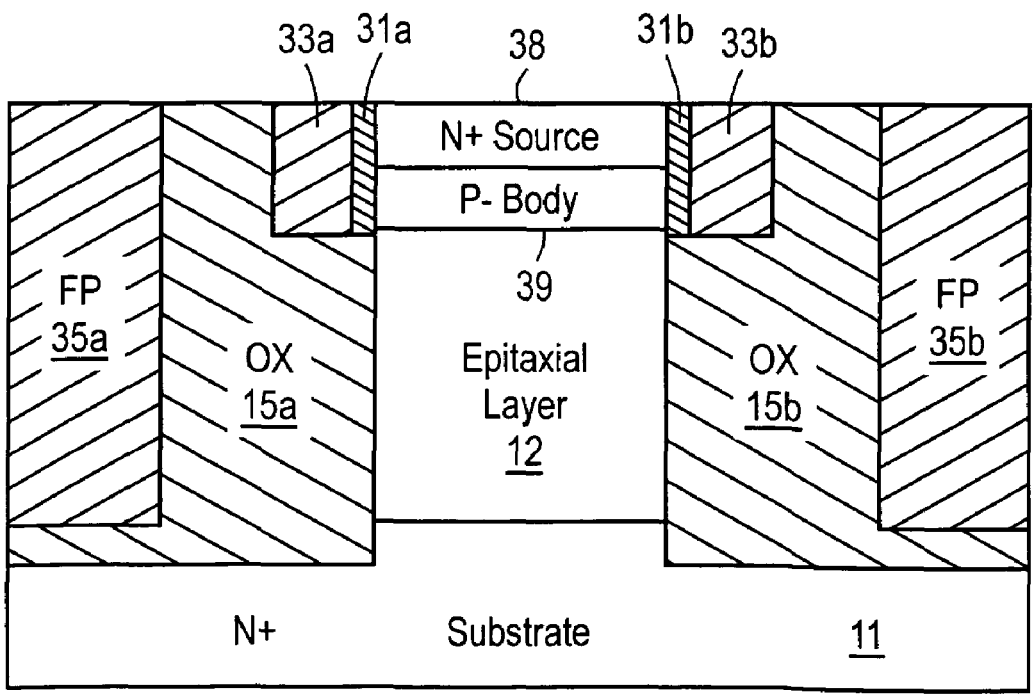
FIG. 1I illustrates the example device structure of FIG. 1H after formation of the source and body regions.

FIG. 1I illustrates the example device structure of FIG. 1H after formation of N+ source region 38 and P-type body region 39 near the top of epitaxial layer 12. Source region 38 and body region 39 may each be formed using ordinary deposition, diffusion, and/or implantation processing techniques. After formation of the N+ source region 38, the HVFET may be completed by forming source, drain, gate, and field plate electrodes that electrically connect to the respective regions/materials of the device using conventional fabrication methods (not shown in the figures for clarity reasons).

Although the present invention has been described in conjunction with specific embodiments, those of ordinary skill in the arts will appreciate that numerous modifications and alterations are well within the scope of the present invention. Accordingly, the specification and drawings are to be regarded in an illustrative rather than a restrictive sense.

I claim:

1. A method comprising:
    etching a semiconductor material of a first conductivity type to form first and second trenches that define a mesa having first and second sidewalls;
    forming first and second dielectric layers respectively covering the first and second sidewalls;
    forming, in a masking layer, first and second openings respectively disposed over the first and second dielectric regions on opposite sides of the mesa, the masking layer having a portion between the first and second openings that covers the mesa and overlaps a distance beyond each edge of the first and second sidewalls coincident with a top surface of the mesa;

anisotropically etching the first and second dielectric regions through the respective first and second openings to create first and second gate trenches;

isotropically etching the first and second dielectric regions in the first and second gate trenches to remove the first and second sidewall portions;

thermally forming a gate oxide on each of the first and second sidewalls of the mesa following the isotropic etching of the first and second dielectric regions; and forming first and second gate members in the first and second gate trenches, respectively, the first and second gate members comprising polysilicon and being respectively insulated from the first and second sidewalk by the gate oxide.

2. The method of claim 1 further comprising forming first and second field plate members in the first and second trenches, respectively, the first and second field plate members being insulated from the mesa by the first and second dielectric regions, respectively.

3. The method of claim 1 wherein the distance is approximately 0.2 μm to 0.5 μm.

4. The method of claim 1 wherein the distance is greater than a worst-case misalignment of the masking layer.

5. The method of claim 1 further comprising forming a body region near a top surface of the mesa adjacent the first and second gate members, the body region being of a second conductivity type.

6. The method of claim 5 further comprising forming a source region of the first conductivity type at the top surface of the mesa, the source region being disposed above the body region.

* * * * *